(12) United States Patent
Nagatomo

(10) Patent No.: US 7,485,931 B2
(45) Date of Patent: Feb. 3, 2009

(54) SEMICONDUCTOR INTEGRATED CIRCUIT

(75) Inventor: Shigeru Nagatomo, Miyazaki (JP)

(73) Assignee: Oki Semiconductor Co., Ltd. (JP)

( * ) Notice: Subject to any disclaimer, the term of this patent is extended or adjusted under 35 U.S.C. 154(b) by 498 days.

(21) Appl. No.: 11/384,361

(22) Filed: Mar. 21, 2006

(65) Prior Publication Data

US 2006/0214234 A1 Sep. 28, 2006

(30) Foreign Application Priority Data

Mar. 25, 2005 (JP) .............................. 2005-088186

(51) Int. Cl.
*H01L 23/62* (2006.01)
(52) U.S. Cl. .................... 257/363; 257/371; 257/370; 257/E27.03
(58) Field of Classification Search ................ 257/273, 257/370, 378; 327/564–566
See application file for complete search history.

(56) References Cited

U.S. PATENT DOCUMENTS 5,338,986 A 8/1994 Kurimoto

FOREIGN PATENT DOCUMENTS

JP 5-335500 12/1993
JP 9-8147 1/1997

*Primary Examiner*—N Drew Richards
*Assistant Examiner*—Mamadou Diallo
(74) *Attorney, Agent, or Firm*—Studebaker & Brackett PC; Donald R. Studebaker

(57) ABSTRACT

A semiconductor integrated circuit has complementary field-effect transistors, one formed in a semiconductor substrate, the other formed in a well in the substrate, and has four power-supply potentials: two supplied to the sources of the field-effect transistors, one supplied to the substrate, and one supplied to the well. An unwanted pair of parasitic bipolar transistors are formed in association with the field-effect transistors. An intentionally formed bipolar transistor operates in series with one of the unwanted parasitic transistors and as a current mirror for the other unwanted parasitic transistor, limiting the flow of unwanted current through the parasitic bipolar transistors.

20 Claims, 12 Drawing Sheets

SEMICONDUCTOR INTEGRATED CIRCUIT

BACKGROUND OF THE INVENTION

1. Field of the Invention

The present invention relates in general to semiconductor integrated circuits, and more particularly to the reduction of parasitic transistor current in complementary metal-oxide-semiconductor (CMOS) integrated circuits.

2. Description of the Related Art

It is well known that the doped semiconductor layers of CMOS integrated circuits form parasitic bipolar transistors that conduct unwanted current under certain conditions. FIG. 1 shows an example, discussed in U.S. Pat. No. 5,338,986 to Kurimoto (and the corresponding Japanese Patent Application Publication No. 5-335500), of an inverting output circuit formed on a P-type semiconductor substrate 601 with an N-type well 602. A P-type source region 603, a P-type drain region 604, and a gate electrode 605 at the surface of the N-type well 602 constitute a P-channel metal-oxide-semiconductor field-effect transistor (PMOS transistor) 606. Also disposed at the surface of the N-type well 602 is an N-doped region 607 with a high impurity concentration. An N-type source region 608, an N-type drain region 609, and a gate electrode 610 at the surface of the P-type substrate 601 constitute an N-channel metal-oxide-semiconductor field-effect transistor (NMOS transistor) 611. A P-doped region 612 with a high impurity concentration is also formed in the surface of the substrate 601.

The P-type source region 603 is biased to a first power supply potential VCC of, for example three volts (3 V). The N-type well 602 is biased through the N-type highly doped region 607 to a second power supply potential VDD of, for example, 15 V. The N-type source region 608 is biased to a third power supply potential VSS of, for example, zero volts (0 V). The P-type substrate 601 is biased through the P-type highly doped region 612 to a fourth power supply potential VEE of, for example, −15 V. VCC and VSS are supplied from an external source; VDD and VEE are generated from VCC and VSS by a potential converter (not shown) in the integrated circuit chip.

This circuit includes two parasitic bipolar transistors Q1, Q2. Transistor Q1 has a PNP structure formed by the P-type source region 603, the N-type well 602, and the P-type substrate 601; transistor Q2 has an NPN structure formed by N-type source region 608, the P-type substrate 601, and the N-type well 602. Parasitic resistors R1 to R4 are also present. R1, determined by the distance between regions 603 and 607, is the base resistance of transistor Q1; R2, determined by the distance between regions 607 and 608, is the collector resistance of transistor Q2; R3, determined by the distance between regions 603 and 612, is the collector resistance of transistor Q1; R4, determined by the distance between regions 608 and 612, is the base resistance of transistor Q2. These parasitic transistors and resistors, shown schematically in FIG. 2, are equivalent to a thyristor, as discussed in Japanese Patent Application Publication No. 9-8147.

Normally VDD exceeds VCC and VSS exceeds VEE (VDD>VCC>VSS>VEE), so PNP transistor Q1 has a base potential (VDD) higher than its emitter potential_(VCC) and NPN transistor Q2 has a base potential (VEE) lower than its emitter potential (VSS). Both parasitic transistors Q1, Q2 are accordingly switched off and do not affect circuit operation.

Since VDD and VEE are generated from VCC and VSS, however, at power-up VCC and VSS reach their normal levels before VDD and VEE. There is therefore an interval during which VCC and VSS are stable while VDD and VEE are still rising and falling. During this interval, VCC may exceed VDD (VCC>VDD) and VEE may exceed VSS (VSS<VEE), allowing the parasitic transistors Q1, Q2 to turn on and leading to the unwanted flow of currents I1, I2 from VCC to VSS as indicated in FIG. 2.

These currents I1, I2 have various adverse effects on the operation of the integrated circuit. For example, they can cause excessive standby current dissipation. They may also overload the potential converter and prevent it from generating the necessary VDD and VEE potentials. In the worst case, the integrated circuit chip as a whole is so overloaded by parasitic currents that it is destroyed.

SUMMARY OF THE INVENTION

An object of the present invention is to reduce unwanted current flow through parasitic transistors in a semiconductor integrated circuit.

In a semiconductor integrated circuit having a well of a first conductive type formed in a semiconductor substrate of a second conductive type, with a first field-effect transistor and a highly doped well-biasing region of the first conductive type disposed at the surface of the well, the first field-effect transistor having a source connected to a first power supply line, the highly doped well-biasing region being connected to a second power supply line, and with a second field-effect transistor and a highly doped substrate-biasing region of the second-conductive type disposed at the semiconductor substrate surface, the second field-effect transistor having a source connected to a third power supply line, the highly doped substrate-biasing region being connected to a fourth power supply line, the invention provides a bipolar transistor disposed in the semiconductor substrate or in the same another well. The bipolar transistor is formed intentionally, but may be a parasitic transistor associated with intentionally formed doped regions.

In one aspect of the invention, the bipolar transistor has a base of the first conductive type, and a collector and an emitter of the second conductive type. The base and collector are electrically connected to the second power line and thus to the highly doped well-biasing region. The emitter is connected to the first power line.

In another aspect of the invention, the bipolar transistor has a base of the second conductive type, and a collector and an emitter of the first conductive type. The base and collector are electrically connected to the fourth power line and thus to the highly doped substrate-biasing region. The emitter is connected to the third power line.

In both aspects of the invention, there are potentially troublesome parasitic bipolar transistors associated with the first and second field-effect transistors. The intentionally formed bipolar transistor limits current flow through these parasitic transistors by operating in series with one of the parasitic transistors and operating as a current mirror of the other parasitic transistor.

DETAILED DESCRIPTION OF THE INVENTION

Figure 1:
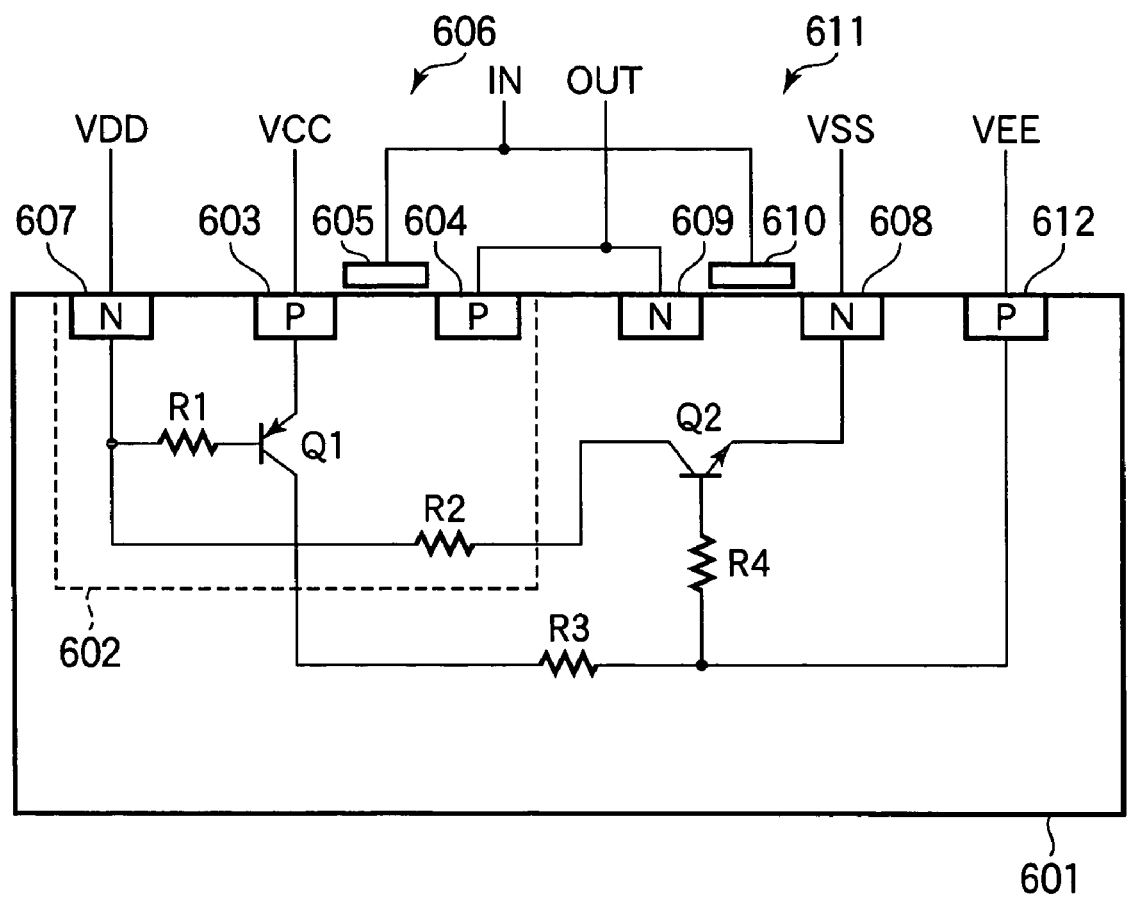
FIG. 1 is a schematic sectional diagram of a conventional semiconductor integrated circuit.

Embodiments of the invention will now be described with reference to the attached drawings, in which like elements are indicated by like reference characters.

FIRST EMBODIMENT

Figure 3:
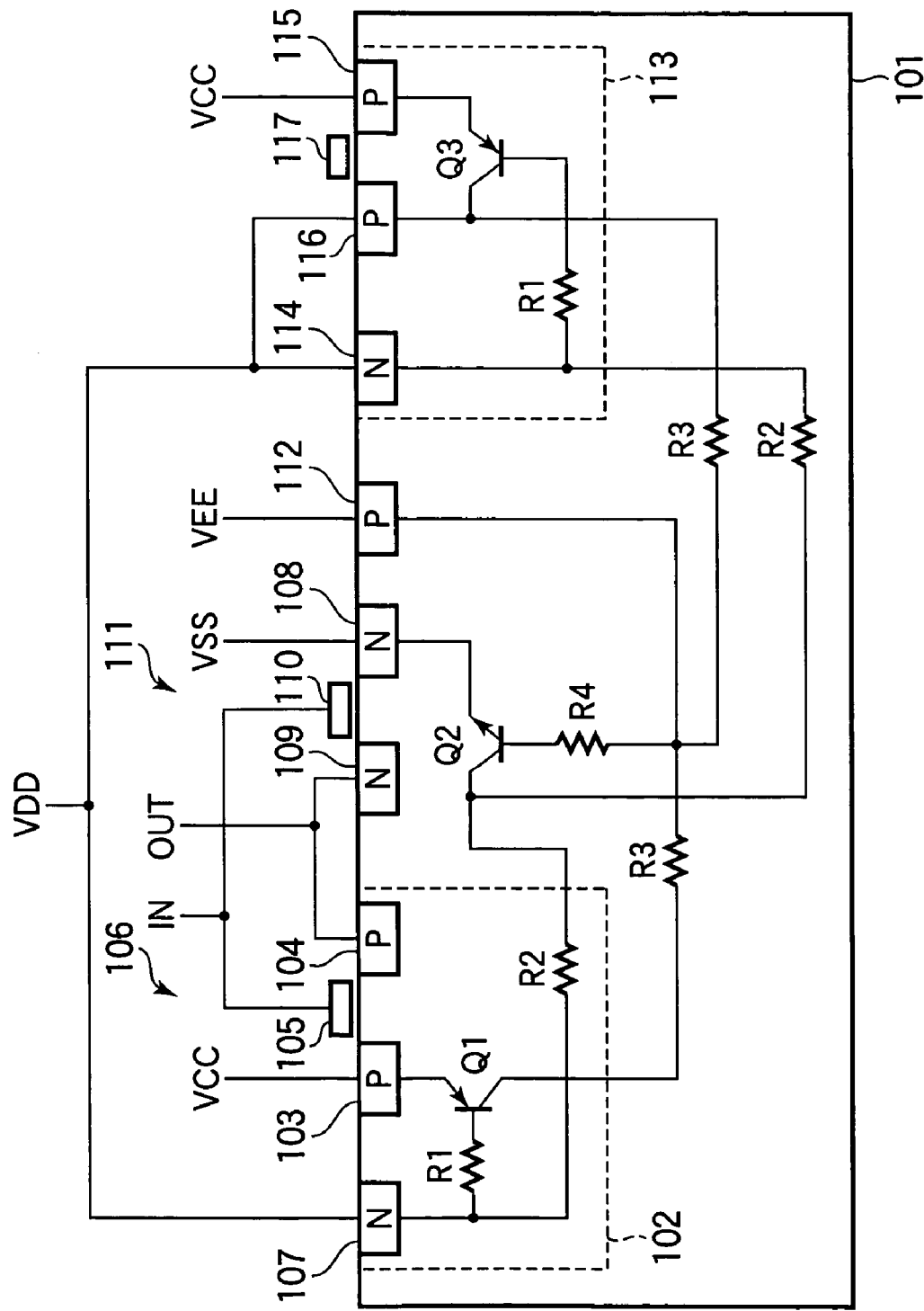
FIG. 3 is a schematic sectional diagram of a semiconductor integrated circuit according to a first embodiment of the invention.

Referring to FIG. 3, the first embodiment has a P-type substrate 101 in which N-type wells 102, 113 are formed.

A P-type source region 103, a P-type drain region 104, and a gate electrode 105 are formed in and above N-type well 102. The P-type source region 103 is formed in the surface of the N-type well 102 and is connected to a VCC power line (where VCC is 3 V, for example). The P-type drain region 104 is formed in the surface of the N-type well 102 and is connected to a signal output line (OUT). The gate electrode 105 is formed above the area between the P-type source region 103 and P-type drain region 104, separated from the surface of the well 102 by a well-known oxide film (not shown), and is connected to a signal input line (IN). The P-type source region 103, P-type drain region 104, and gate electrode 105 constitute a PMOS transistor 106.

In addition, an N-type highly doped region 107 formed in the surface of the N-type well 102 is connected to a VDD power line (where VDD is 15 V, for example) to bias the N-type well 102.

An N-type source region 108, an N-type drain region 109, and a gate electrode 110 are formed in a P-type region of the P-type substrate 101. The N-type source region 108 is formed in the surface of the P-type region and is connected to a VSS power line (where VSS is 0 V, for example). The N-type drain region 109 is formed in the surface of the P-type region and is connected to the signal output line (OUT). The gate electrode 110 is formed above the area between the N-type source region 108 and the N-type drain region 109, separated from the surface of the P-type substrate 101 by an oxide film (not shown), and is connected to the signal input line (IN). The N-type source region 108, N-type drain region 109, and gate electrode 110 constitute an NMOS transistor 111.

In addition, a P-type highly doped region 112 formed in the surface of the P-type region of the P-type substrate 101 is connected to a VEE power line (where VEE is −15 V, for example) to bias the P-type substrate 101.

The PMOS transistor 106 and NMOS transistor 111 constitute a CMOS inverter.

A single N-type highly doped region 114 and two P-type doped regions 115, 116 are formed in the surface of N-type well 113. The N-type highly doped region 114 and P-type doped region 116 are both connected to the VDD power line; P-type doped region 115 is connected to the VCC power line. To facilitate the design and fabrication process a gate electrode 117 is also formed, so that N-type well 102 and N-type well 113 have completely identical circuit configurations, but gate electrode 117 is not used. The N-type well 113, P-type doped region 115, and P-type doped region 116 constitute a lateral PNP bipolar transistor as described below.

As shown in FIG. 3, three bipolar transistors Q1, Q2, Q3 are formed in the P-type substrate 101. Parasitic transistor Q1 has a PNP structure formed by the P-type source region 103, N-type well 102, and P-type substrate 101; parasitic transistor Q2 has an NPN structure formed by the N-type source region 108, P-type substrate 101, and N-type well 102; transistor Q3 has a lateral PNP structure formed by P-type doped region 115, N-type well 113, and P-type doped region 116. N-type highly doped region 114 functions as the base electrode of transistor Q3, P-type doped region 115 being the emitter and P-type doped region 116 the collector. Since the base and collector electrodes are interconnected, transistor Q3 operates as a diode.

Parasitic resistors are also formed in the P-type substrate 101, with values depending on the distances between the doped regions. In the example shown in FIG. 3, the base resistance R1 of transistor Q1 is determined by the distance between regions 103 and 107, the collector resistance R2 of transistor Q2 by the distance between regions 107 and 108, the collector resistance R3 of transistor Q1 by the distance between regions 103 and 112, and the base resistance R4 of transistor Q2 by the distance between regions 108 and 112. The base resistance of transistor Q3 is equal to the base resistance of transistor Q1 and is also denoted R1.

The semiconductor substrate 101 also functions as a second collector of bipolar transistor Q3, and N-type well 113 functions as a second collector of parasitic bipolar transistor Q2. These second collectors have collector resistances R2 and R3 similar to the collector resistances R2, R3 that obtain between transistors Q1 and Q2.

Figure 4:
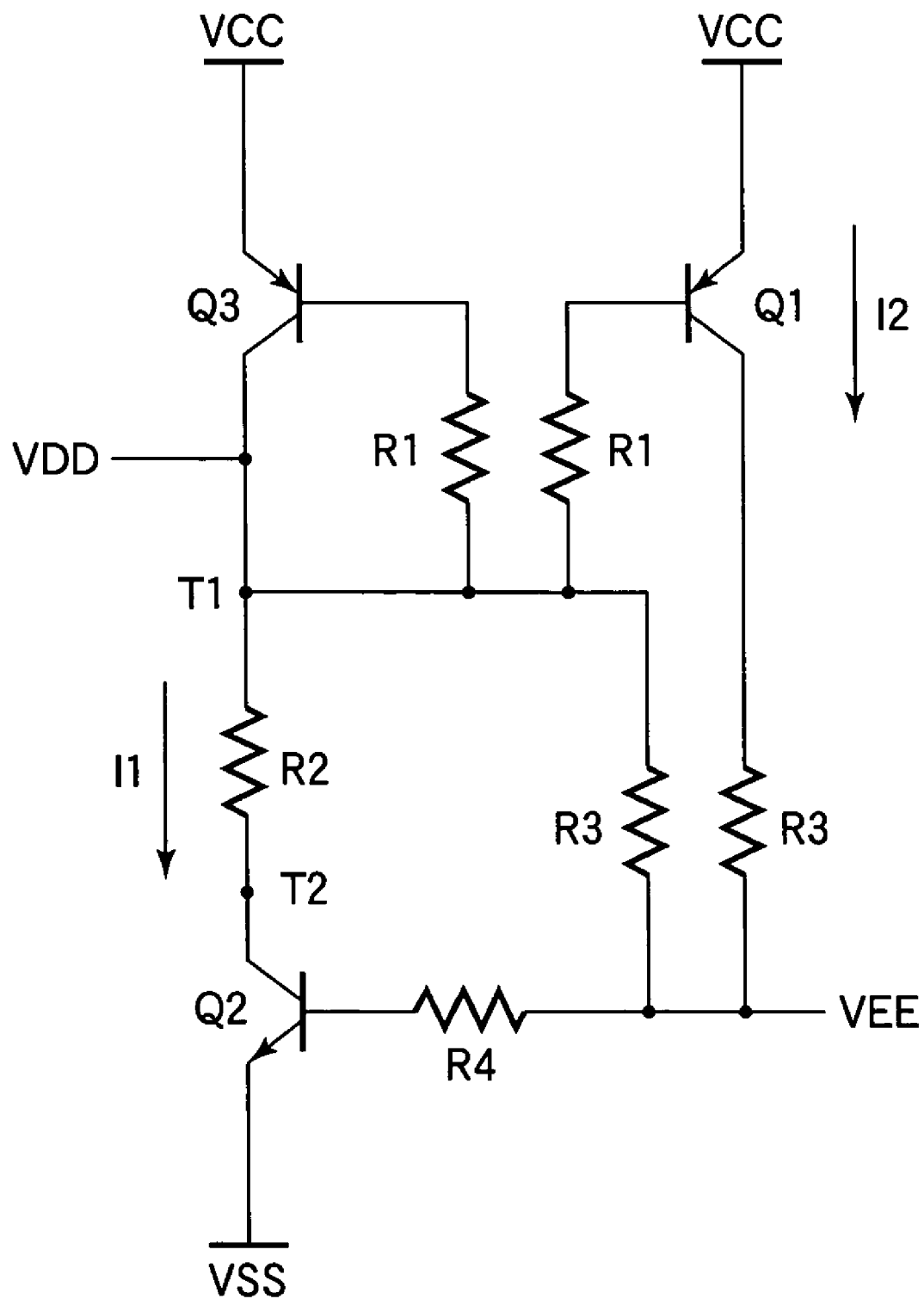
FIG. 4 is a schematic circuit diagram of the semiconductor integrated circuit in FIG. 3.

The transistors and resistors shown schematically in FIG. 3 are equivalent to the circuit in FIG. 4, which has been simplified by showing only one collector for each bipolar transistor, combining the two resistors R2 into a single resistor, and combining the two resistors R3 into a single resistor. Transistors Q1 and Q3 operate as a current mirror because their emitters are identically connected to VCC and their bases are connected through identical resistances R1 to the VDD power supply wiring.

The operation of the first embodiment will now be described.

Figure 2:
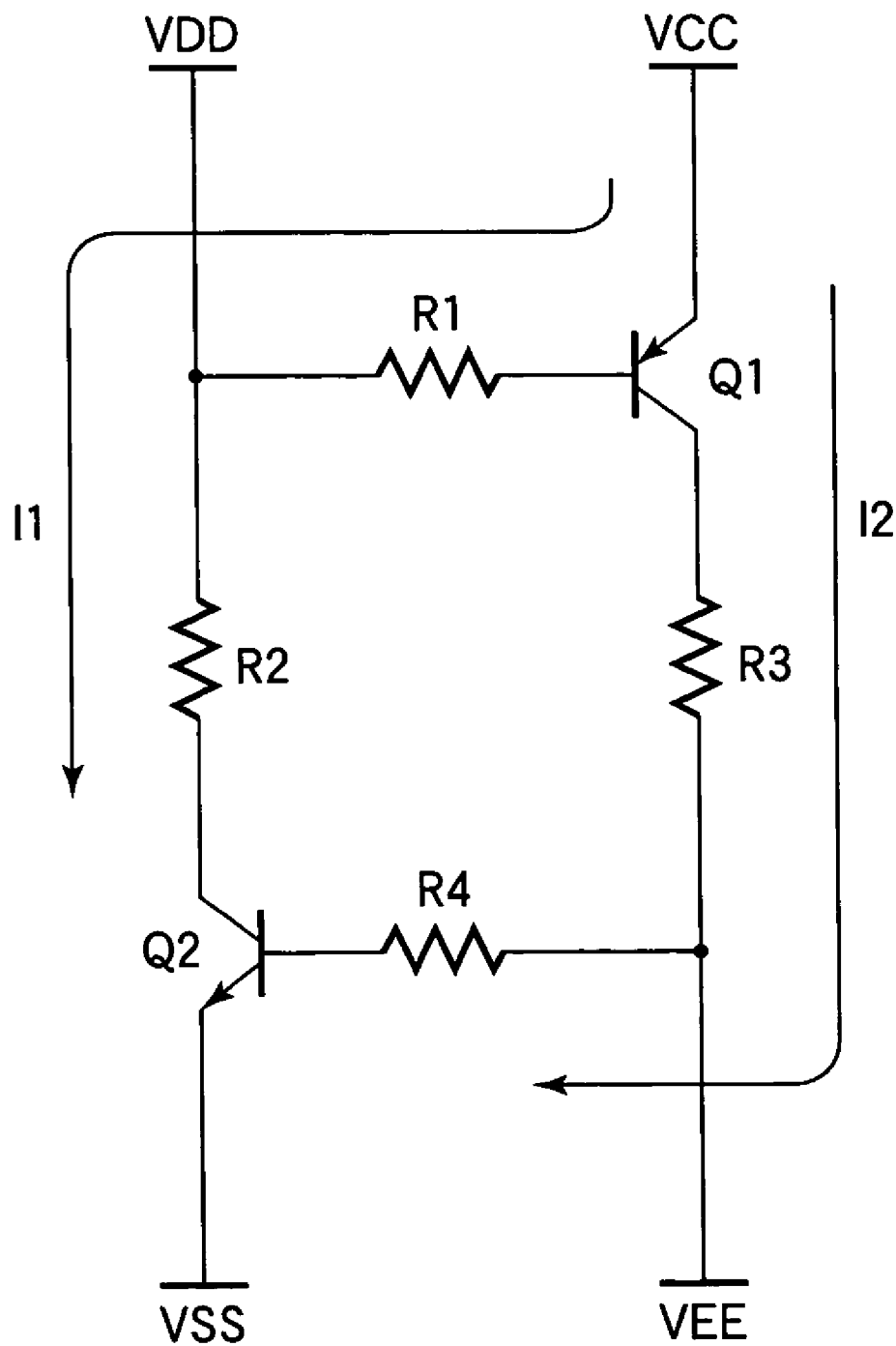
FIG. 2 is a schematic circuit diagram of the conventional semiconductor integrated circuit.

As in the conventional semiconductor integrated circuit (see FIG. 2), normally VDD exceeds VCC and VSS exceeds VEE (VDD>VCC>VSS>VEE), so parasitic transistors Q1, Q2 are switched off. The additional bipolar transistor Q3 is also switched off because its base potential is higher than its emitter potential (VDD>VCC). Accordingly, transistors Q1, Q2, Q3 do not affect circuit operation.

At power-up, however, as in the conventional circuit, there is an interval during which VCC and VSS are stable and VDD and VEE are unstable. In this interval, VCC may exceed VDD (VCC>VDD) and VEE may exceed VSS (VEE>VSS). The former condition (VCC>VDD) allows the PNP transistors Q1, Q3 to turn on because their emitter potential is higher than their base potential. The latter condition (VEE>VSS) allows the NPN transistor Q2 to turn on because its base potential is higher than its emitter potential. Currents I1, I2 then flow through transistors Q1, Q2, Q3 as indicated in FIG. 4.

Current I1 generates a voltage difference between the terminals T1, T2 at the two ends of parasitic resistor R2. The potential at terminal T1 can vary because VDD is still undetermined. The circuit (not shown) that generates VDD from VCC may be configured to defer the supply of power to the VDD power supply wiring until a stable VDD voltage is available. During the interval in which VDD is unstable or unavailable, the potential at terminal T1 is pulled up by transistor Q3, operating as a diode, to a value less than VCC by an amount not greatly exceeding the cut-in voltage of transistor Q3. In this state, since transistor Q3 operates near its cut-in point, its conductivity is low and current I1 is limited. Since parasitic transistor Q1 forms a current mirror circuit with transistor Q3, current I2 is similarly limited. That is, the base current of parasitic transistor Q2 is limited, a factor which also limits the collector current (I1) at terminal T2.

As described above, according to the first embodiment, transistor Q3 is formed intentionally to reduce unwanted current flow through parasitic transistors Q1 and Q2. Various adverse effects on the operation of the integrated circuit, such as failure to start up, excessive standby current dissipation, and circuit destruction, can thereby be prevented.

In a variation of the first embodiment, doped regions 103, 104, 107 and doped regions 114, 115, 116 are formed in the same N-well instead of being formed in separate N-wells. The P-type doped regions 103 and 115 connected to VCC may then be combined into a single doped region, and the N-type highly doped regions 107, 115 connected to VDD may also be combined into a single highly doped region.

In another variation of the first embodiment, bipolar transistor Q3 is a parasitic transistor intentionally formed by doped regions of one or more functioning circuit elements.

SECOND EMBODIMENT

Figure 5:
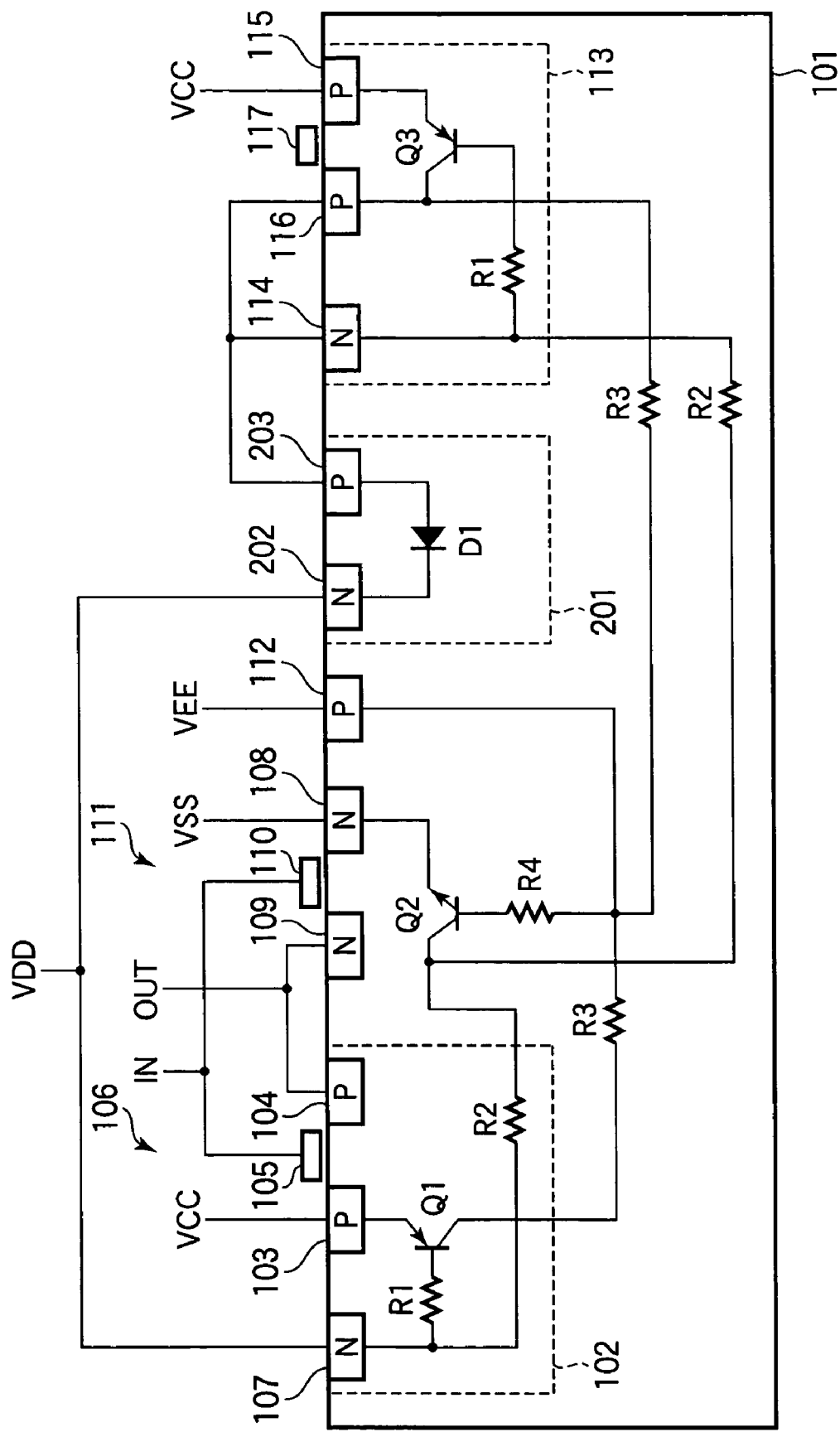
FIG. 5 is a schematic sectional diagram of a semiconductor integrated circuit according to a second embodiment.

Referring to FIG. 5, the second embodiment includes all of the constituent elements of the first embodiment, and has an additional N-type well 201 formed in the P-type substrate 101. An N-type highly doped region 202 and a P-type doped region 203 are formed in this N-type well 201. The N-type highly doped region 202 is connected to the VDD power line. The P-type doped region 203 is connected through a wiring pattern to the N-type highly doped region 114 and P-type doped region 116 in N-type well 113. Differing from the first embodiment, the second embodiment does not connect the N-type highly doped region 114 and P-type doped region 116 in N-type well 113 directly to the VDD power line.

As shown in FIG. 5, a diode D1 is formed in the N-type well 201. The cathode of the diode D1 is the N-type highly doped region 202 connected to the VDD power line. The cathode is thus connected to the node at which parasitic resistors R2 and R3 are interconnected. This node corresponds to N-type highly doped region 107 in N-type well 102. The anode of diode D1 is the P-type doped region 203 connected to the collector of lateral transistor Q3 and thus through a parasitic resistor R1 to the base of transistor Q3.

Figure 6:
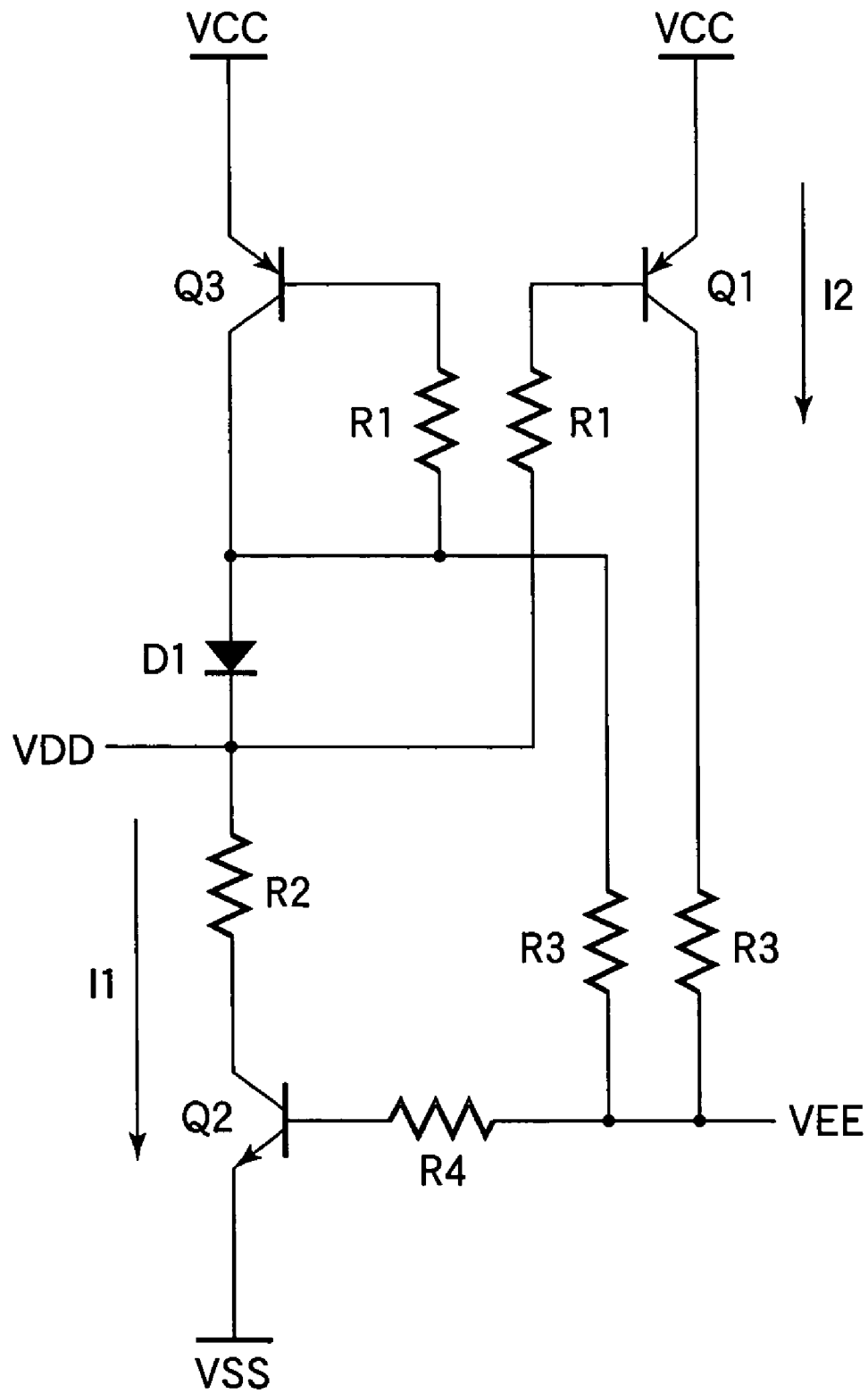
FIG. 6 is a schematic circuit diagram of the semiconductor integrated circuit in FIG. 5.

The transistors, resistors, and diode shown schematically in FIG. 5 are equivalent to the circuit in FIG. 6. The operation of the second embodiment will be described with reference to FIG. 6.

As in the first embodiment (see FIG. 3), normally VDD exceeds VCC and VSS exceeds VEE (VDD>VCC>VSS>VEE), so the bipolar transistors Q1, Q2, Q3 are all switched off and do not affect circuit operation.

At power-up, however, for the same reason as in the first embodiment, there is an interval during which VCC may exceed VDD (VCC>VDD) and VEE may exceed VSS (VEE>VSS), allowing the bipolar transistors Q1, Q2, Q3 to turn on and leading to the unwanted flow of currents I1, I2 from VCC to VSS as indicated in FIG. 6.

In the second embodiment, since diode D1 is in series with parasitic resistor R2, the emitter-to-collector and emitter-to-base voltages of transistor Q3 are further reduced, in comparison with the first embodiment, by an amount corresponding to the forward voltage (approximately 0.5 V) of diode D1. The value of current I1 therefore becomes smaller than in the first embodiment.

The effect on current I2 is similar to the effect in the first embodiment.

As described above, because of the additional diode D1, the second embodiment reduces unwanted current flow through parasitic transistors by a greater amount than does the first embodiment. The second embodiment is therefore even more effective in preventing adverse effects such as failure to start up, excessive standby current dissipation, and circuit destruction.

THIRD EMBODIMENT

Figure 7:
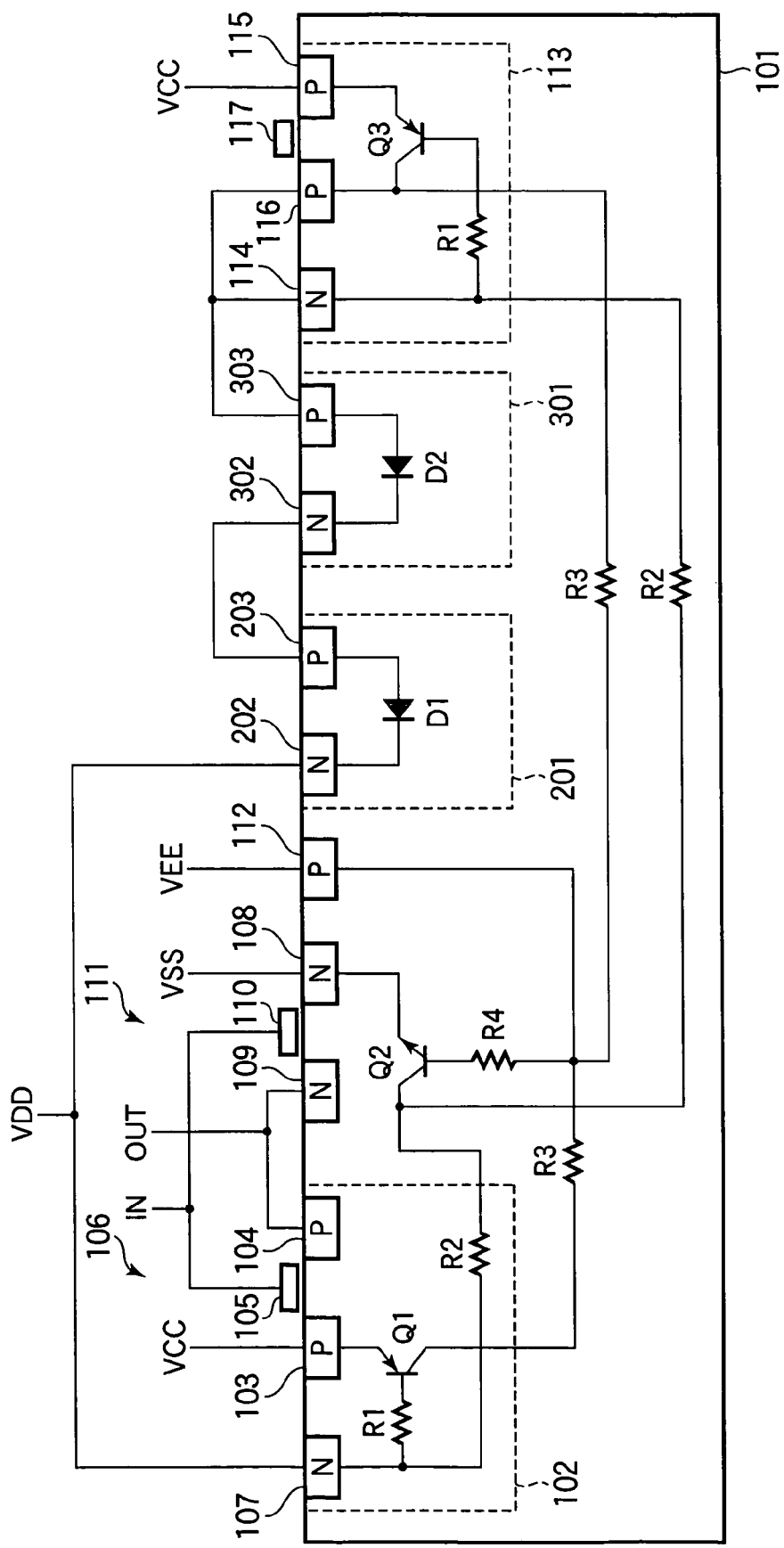
FIG. 7 is a schematic sectional diagram of a semiconductor integrated circuit according to a third embodiment.

Referring to FIG. 7, the third embodiment includes all of the constituent elements of the second embodiment, and has an additional N-type well 301 formed in the P-type substrate 101. An N-type highly doped region 302 and a P-type doped region 303 are formed in this N-type well 301.

As in the second embodiment, the N-type highly doped region 202 in N-type well 201 is connected to the VDD power line. The P-type doped region 203 in N-type well 201 is connected through a wiring pattern to the N-type highly doped region 302 in N-type well 301. The P-type doped region 303 in N-type well 301 is connected through a wiring pattern to the N-type highly doped region 114 and P-type doped region 116 in N-type well 113.

As shown in FIG. 7, the diodes D1, D2 formed in N-type wells 201 and 301 are connected in series. The cathode of diode D1 is connected to the VDD power line and thus to the one end of parasitic resistor R2. The anode of diode D2 is connected to the collector of transistor Q3 and through a parasitic resistor R1 to the base of transistor Q3.

In a variation of the third embodiment, the number of diodes connected in series is increased to three or more.

Figure 8:
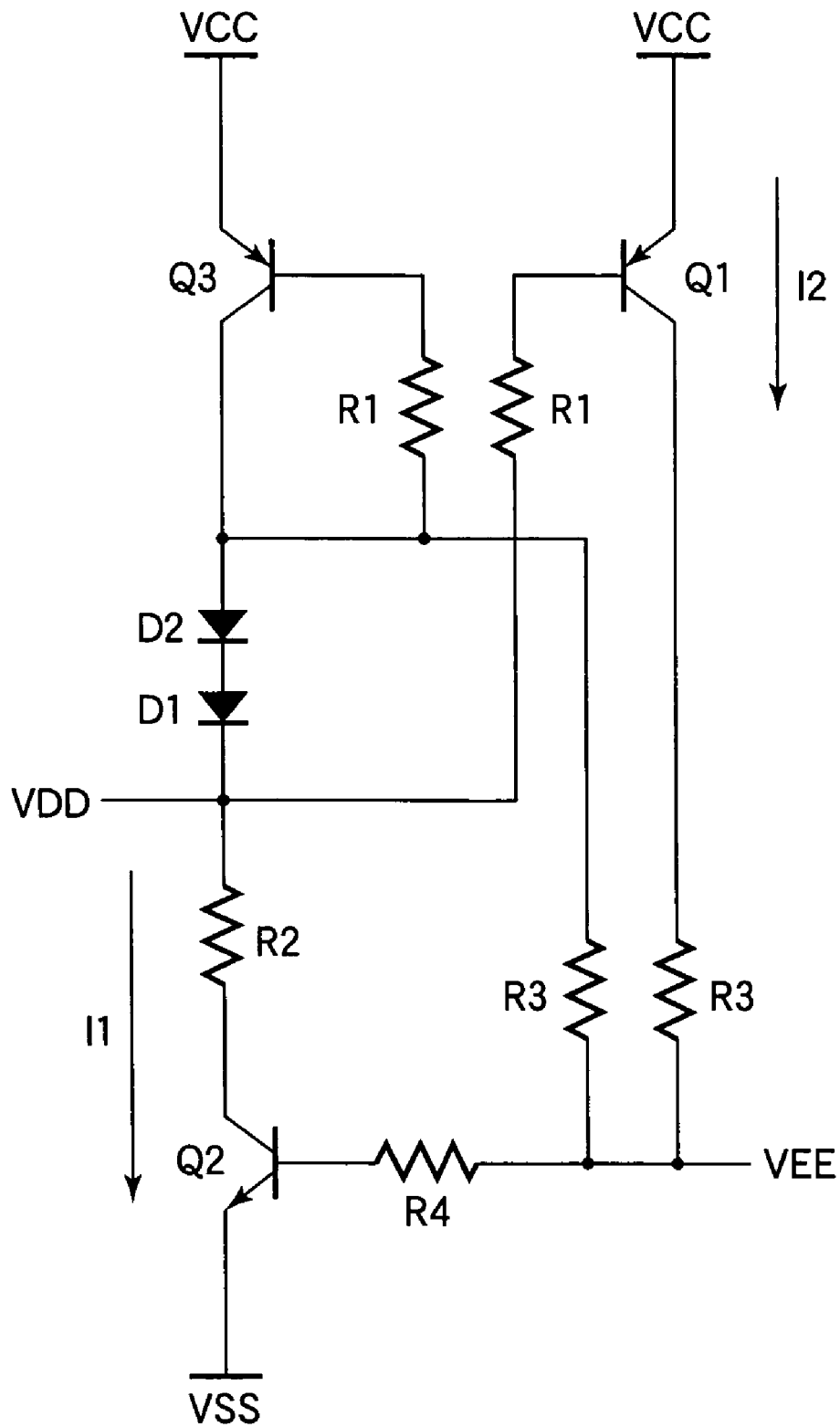
FIG. 8 is a schematic circuit diagram of the semiconductor integrated circuit in FIG. 7.

The transistors, resistors, and diodes shown schematically in FIG. 7 are equivalent to the circuit in FIG. 8. The operation of the third embodiment will be described with reference to FIG. 8.

As in the second embodiment (see FIG. 6), normally VDD exceeds VCC and VSS exceeds VEE (VDD>VCC>VSS>VEE), so the bipolar transistors Q1, Q2, Q3 are all switched off and do not affect circuit operation.

At power-up, however, for the same reason as in the first embodiment, there is an interval during which the bipolar transistors Q1, Q2, Q3 turn on, leading to the unwanted flow of currents I1, I2 from VCC to VSS as indicated in FIG. 8.

In the third embodiment, diode D2 is added in series with parasitic resistor R2 and diode D1. Each time the number of diodes connected in series is increased by one, the emitter-to-collector and emitter-to-base voltage of transistor Q3 is reduced by about 0.5 V. Accordingly, the value of current I1 is further reduced.

If the emitter-to-base voltage of transistor Q1 is reduced to 0.5 V or less, transistor Q1 operates in its cut-off region. In this case even if VCC exceeds VDD (VCC>VDD) and VEE exceeds VSS (VEE>VSS), transistor Q1 does not turn on.

As described above, the third embodiment can reduce unwanted current flow through parasitic transistors even more than can the second embodiment. Adverse effects on the operation of the integrated circuit, such as failure to start up, excessive standby current dissipation, and circuit destruction, can be more effectively prevented than in the second embodiment.

FOURTH EMBODIMENT

Figure 9:
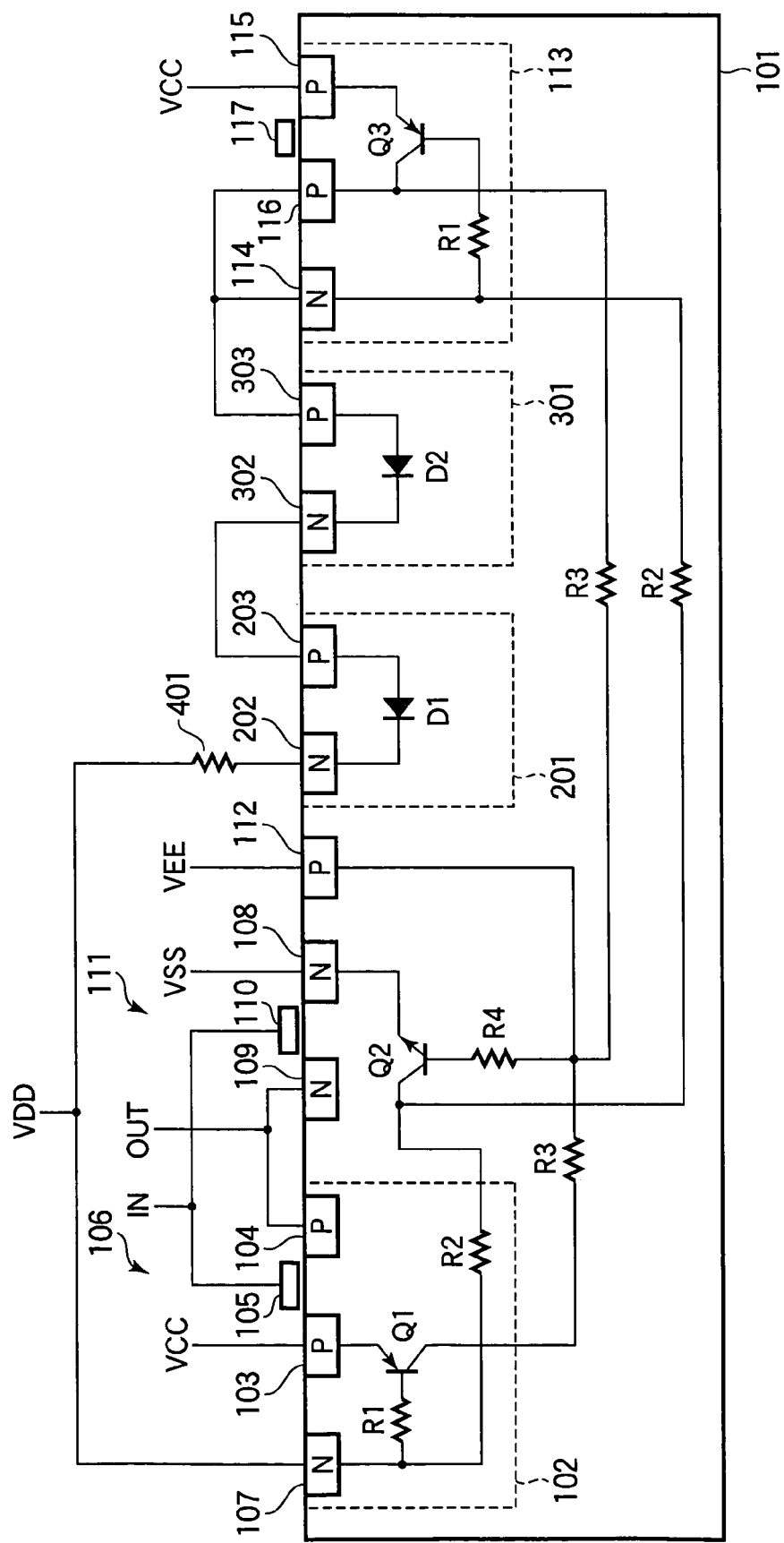
FIG. 9 is a schematic sectional diagram of a semiconductor integrated circuit according to a fourth embodiment.

Referring to FIG. 9, the fourth embodiment includes all of the constituent elements of the third embodiment, and inserts an additional resistor 401 between N-type highly doped region 202 and the VDD power line. Resistor 401 is shown as a lumped element, but it may actually be a distributed element, such as a wiring resistance element.

Figure 10:
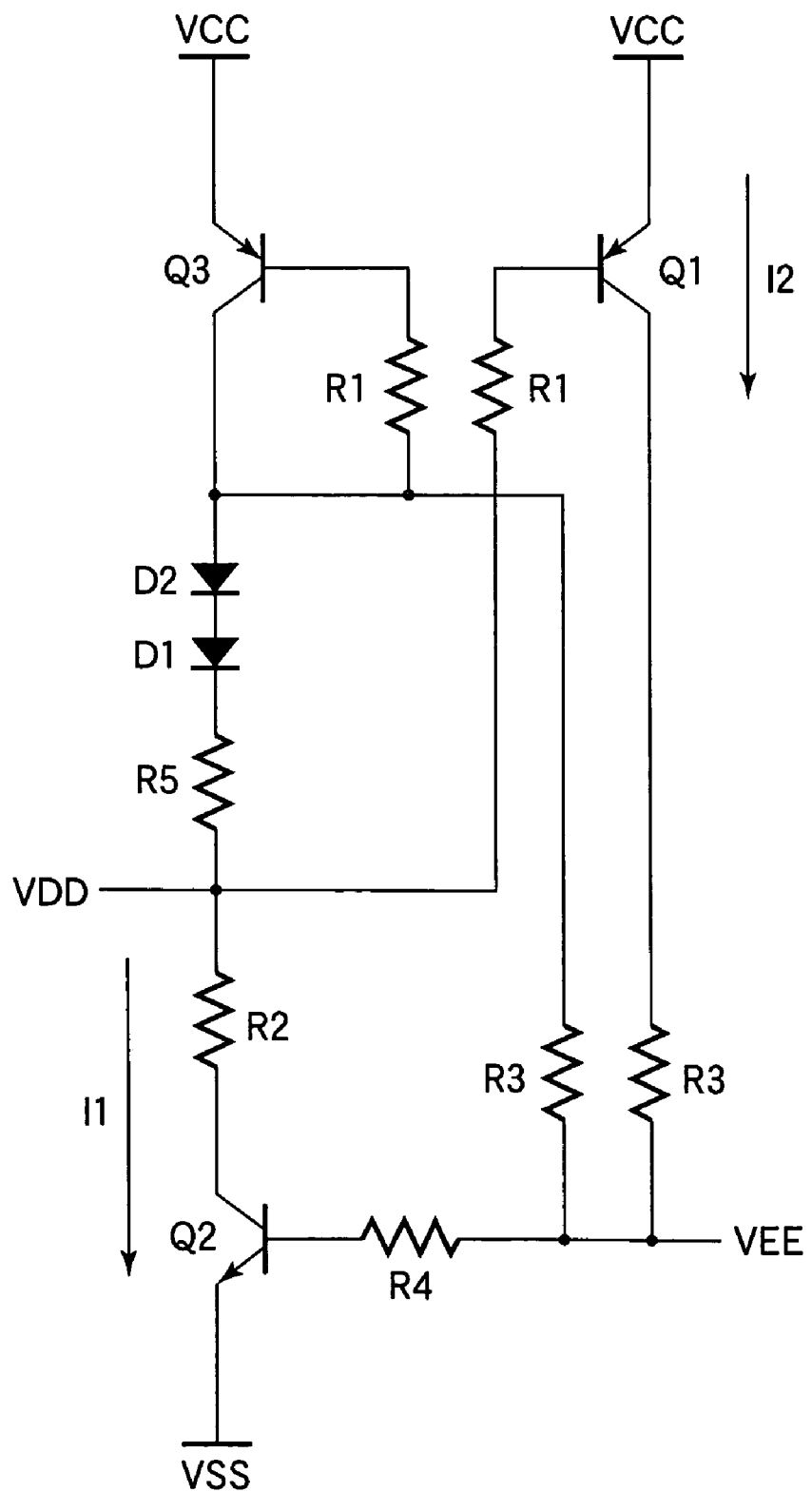
FIG. 10 is a schematic circuit diagram of the semiconductor integrated circuit in FIG. 9.

The transistors, resistors, and diodes shown schematically in FIG. 9 are equivalent to the circuit in FIG. 10. Resistor R5 in FIG. 10, inserted between the cathode of diode D1 and parasitic resistor R2, corresponds to the resistor 401 shown in FIG. 9. In the fourth embodiment, when VCC exceeds VDD (VCC>VDD), VEE exceeds VSS (VEE>VSS), and the transistors Q1, Q2, Q3 turn on, the emitter-to-collector voltage of transistor Q3 and the emitter-to-base voltage of transistors Q1, Q3 are reduced in proportion to the combined resistance (R2 +R5) of resistor 401 and parasitic resistor R2.

In the third embodiment described above, since the emitter-to-base voltage of transistor Q3 is adjusted only by changing the number of diodes connected in series, it can only be adjusted in steps of about 0.5 V. In the fourth embodiment, since the resistance element R5 is provided, the voltage can be adjusted in steps of less than 0.5 V. The current I1 flowing through transistor Q3 can therefore be controlled with a greater degree of design freedom than in the third embodiment.

As described above, the resistor added in the fourth embodiment affords a greater degree of control over unwanted current flow than is possible in the third embodiment. Accordingly, the fourth embodiment gives the circuit designer greater ability to avoid adverse effects on circuit operation, such as failure to start up, excessive standby current dissipation, and circuit destruction.

FIFTH EMBODIMENT

In the embodiments described above, the currents flowing through the parasitic transistors Q1, Q2 are controlled by adding a lateral PNP transistor Q3; in the fifth embodiment, these currents are controlled by adding a lateral NPN transistor.

Figure 11:
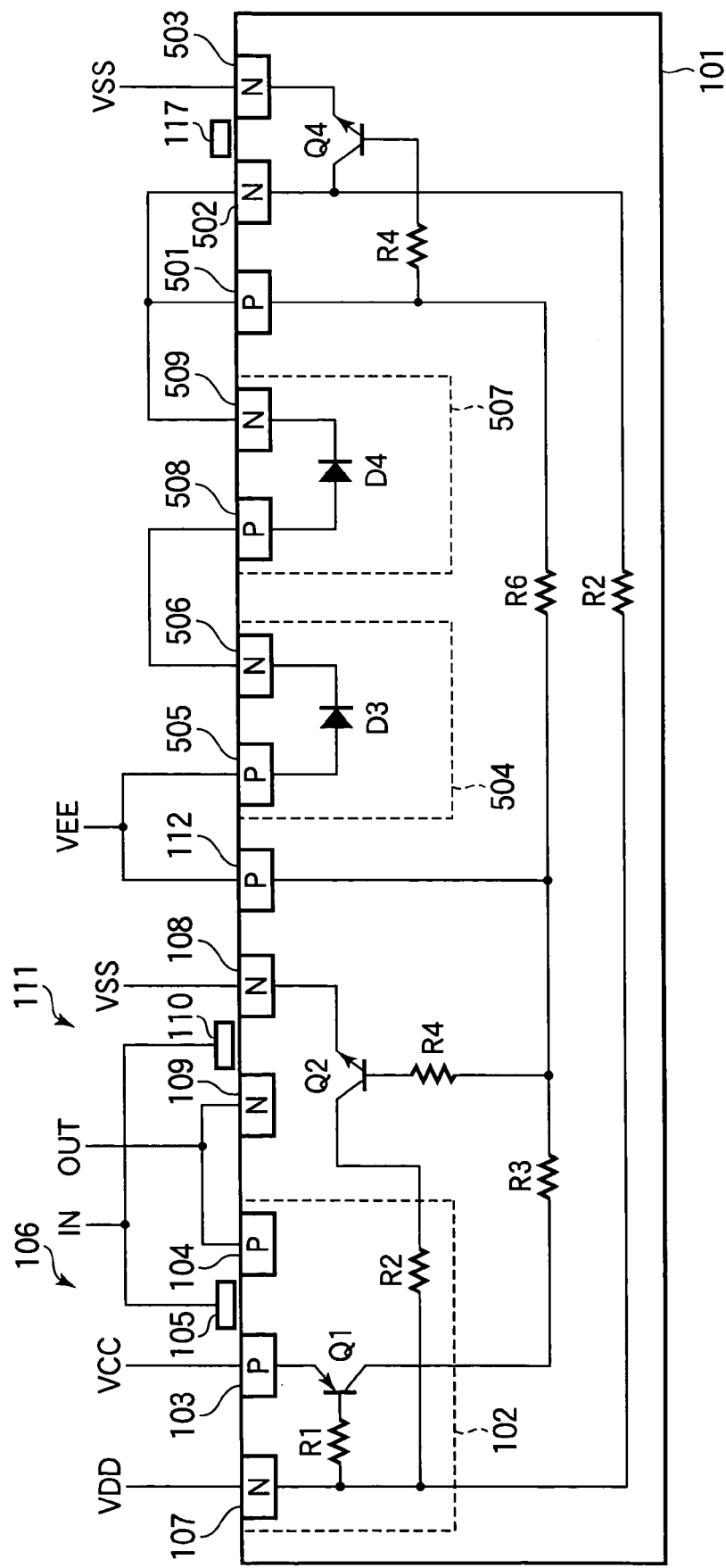
FIG. 11 is a schematic sectional diagram of a semiconductor integrated circuit according to a fifth embodiment.

Referring to FIG. 11, in addition to PMOS transistor 106 and NMOS transistor 111 and their associated highly doped regions 107, 112, a P-type highly doped region 501, two N-type doped regions 502, 503, and two N-type wells 504, 507 are formed in the P-type substrate 101. A P-type doped region 508 and an N-type highly doped region 506 are formed in N-type well 504; a P-type doped region 508 and an N-type highly doped region 509 are formed in N-type well 507. P-type doped region 505 is connected to the VEE power line, and the N-type highly doped region 506 is connected through a wiring pattern to the P-type doped region 508. N-type highly doped region 509 is connected through a wiring pattern to P-type highly doped region 501 and N-type doped region 502. N-type doped region 503 is connected to the VSS power line.

As shown in FIG. 11, doped regions 501, 502, 503 form a lateral NPN transistor Q4 with a base resistance R4 similar to the base resistance R4 of parasitic NPN transistor Q2. The base of NPN transistor Q4 is also connected through a parasitic resistance R6 in the P-type substrate 101 to the node, corresponding to P-type highly doped region 112, at which the parasitic resistors R3 and R4 of NPN transistor Q2 are interconnected, and from this node to the collector of parasitic PNP transistor Q1 through parasitic resistor R3. Similarly, the base of PNP transistor Q1 forms a second collector of NPN transistor Q4, with an associated collector resistance indicated by the same symbol R2 as used for the collector resistance of NPN transistor Q2.

The doped regions 505, 506 in N-type well 504 form a diode D3, and the doped regions 508, 509 in N-type well 507 form a diode D4. The anode of diode D3 is connected to the VEE power line and thus to the node at which parasitic resistors R3 and R4 are interconnected; the cathode of diode D3 is connected to the anode of diode D4. The cathode of diode D4 is connected through a wiring pattern to the collector and base of transistor Q4. The base of transistor Q4 is thus connected to P-type highly doped region 112 through diodes D3 and D4, in parallel with parasitic resistor R6.

Figure 12:
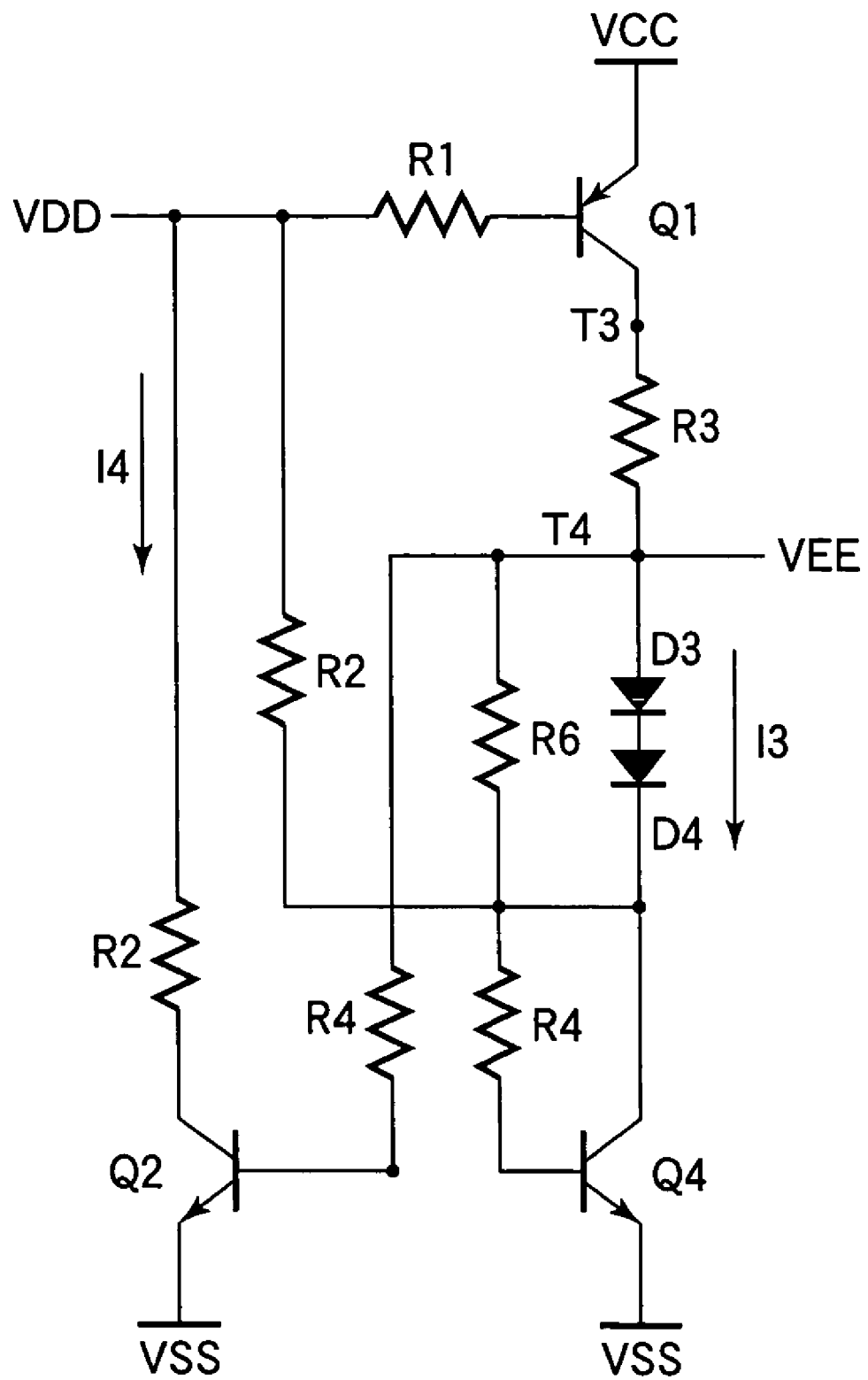
FIG. 12 is a schematic circuit diagram of the semiconductor integrated circuit in FIG. 11.

The bipolar transistors and resistors shown schematically in FIG. 11 are equivalent to the circuit in FIG. 12. The operation of the fifth embodiment will be described with reference to FIG. 12.

During normal operation, VDD exceeds VCC and VSS exceeds VEE (VDD>VCC>VSS>VEE), so parasitic transistors Q1, Q2 are switched off. Lateral NPN transistor Q4 is also switched off because its emitter potential is higher than its base potential (VSS>VEE). Accordingly, bipolar transistors Q1, Q2, Q4 do not affect circuit operation.

At power-up, however, if VCC exceeds VDD (VCC>VDD) and VEE exceeds VSS (VEE>VSS), the PNP parasitic transistor Q1 turns on because it has an emitter potential higher than its base potential and the NPN transistors Q2, Q4 also turn on because they have a base potential higher than their emitter potential. Currents I3, I4 then flow through the bipolar transistors Q1, Q2, Q4.

Current I3 generates a voltage across parasitic resistor R3, between terminals T3 and T4. The potential at terminal T4 (see FIG. 12) can vary because VEE is still unstable or unavailable. During the interval in which VEE is unstable or unavailable, the potential at terminal T4 is pulled down by transistor Q4 to a value that depends on the number of series diodes D3, D4, and the value of parasitic resistor R6. The base-to-emitter voltages of transistors Q2 and Q4 are thereby reduced. In particular, transistor Q4 operates near its cut-in point and its conductivity is low, limiting current I3. Parasitic transistor Q2 also operates with reduced conductivity, limiting current I4.

Like the preceding embodiments, the fifth embodiment can reduce unwanted current flow through parasitic transistors and therefore prevent various adverse effects on the operation of the integrated circuit, such as failure to start up, excessive standby current dissipation, and circuit destruction.

In a variation of the fifth embodiment, the number of diodes formed is zero, one, or three or more, instead of the two shown in FIGS. 11 and 12, to adjust the emitter-to-base voltage of transistor Q4 in steps of about 0.5 V. In addition, as in the fourth embodiment, a resistor may be inserted between P-type doped region 508 and the VEE wiring for finer adjustment of the emitter-to-base voltage of transistor Q4.

Those skilled in the art will recognize that further variations are possible within the scope of the invention, which is defined in the appended claims.

What is claimed is:

1. A semiconductor integrated circuit comprising:
   a first semiconductor region of a first conductive type;
   a second semiconductor region of a second conductive type;
   a first field-effect transistor of a first channel type, having a source and drain disposed in the first semiconductor region;
   a second field-effect transistor of a second channel type, having a source and drain disposed in the second semiconductor region;
   a first power line for biasing the source of the first field-effect transistor to a first potential;
   a second power line for biasing the first semiconductor region to a second potential differing from the first potential; and
   a bipolar transistor having an emitter connected to the first power line, a base connected to the second power line, and a collector connected to the second power line.

2. The semiconductor integrated circuit of claim 1, wherein the bipolar transistor is formed in a third semiconductor region of the first conductive type.

3. The semiconductor integrated circuit of claim 2, wherein the third semiconductor region has a bulk part forming the base of the bipolar transistor.

4. The semiconductor integrated circuit of claim 3, wherein the third semiconductor region further comprises:
   a first doped region of the second conductive type forming the emitter of the bipolar transistor;
   a second doped region of the second conductive type forming the collector of the bipolar transistor; and
   a highly doped region of the first conductive type through which the bulk part of the third semiconductor region is connected to the second power line.

5. The semiconductor integrated circuit of claim 4, further comprising at least one diode inserted in series between the highly doped region and the second power line.

6. The semiconductor integrated circuit of claim 4, further comprising a resistor inserted in series between the highly doped region and the second power line.

7. A semiconductor integrated circuit comprising:
   a semiconductor substrate having a first well of a first conductive type, the semiconductor substrate being of a second conductive type;
   a first field-effect transistor formed in the first well, the first field-effect transistor having a first doped region of the second conductive type connected to a first power line, a second doped region of the second conductive type, a first gate electrode disposed between the first and second doped regions, and an oxide film separating the first gate electrode from the surface of the first well;
   a first highly doped well-biasing region of the first conductive type formed in the first well and connected to a second power line;
   a second field-effect transistor formed in the semiconductor substrate, the second field-effect transistor having a third doped region of the first conductive type connected to a third power line, a fourth doped region of the first conductive type, a second gate electrode disposed between the third and fourth doped regions, and an oxide film separating the second gate electrode from the surface of the semiconductor substrate;
   a highly doped substrate-biasing region of the second conductive type formed in the semiconductor substrate and connected to a fourth power line; and
   a bipolar transistor having a base of the first conductive type, and a collector and an emitter of the second conductive type, the base and the collector being electrically connected to the first highly doped well-biasing region, the emitter being connected to the first power line.

8. The semiconductor integrated circuit of claim 7, further comprising a second well of the first conductive type formed in the semiconductor substrate, the bipolar transistor being disposed in the second well, the second well including:
   a second highly doped well-biasing region of the first conductive type functioning as a base electrode of the bipolar transistor;
   a fifth doped region of the second conductive type functioning as the emitter of the bipolar transistor; and
   a sixth doped region of the second conductive type functioning as a collector electrode of the bipolar transistor;
   the second highly doped well-biasing region and the sixth doped region being mutually interconnected, and connected to the first highly doped well-biasing region by a wiring pattern of the second power supply line.

9. The semiconductor integrated circuit of claim 7, further comprising a diode formed in the semiconductor substrate and connected in series between the highly doped well-biasing region and the collector of the bipolar transistor.

10. The semiconductor integrated circuit of claim 9, wherein the diode produces a voltage drop that brings a base-emitter voltage of the bipolar transistor into a cut-off region of the bipolar transistor.

11. The semiconductor integrated circuit of claim 7, further comprising a plurality of diodes formed in the semiconductor substrate, connected in series between the highly doped well-biasing region and the collector of the bipolar transistor.

12. The semiconductor integrated circuit of claim 11, wherein the diodes produce a series voltage drop that brings a base-emitter voltage of the bipolar transistor into a cut-off region of the bipolar transistor.

13. The semiconductor integrated circuit of claim 7, further comprising a resistor connected in series between the highly doped well-biasing region and the collector of the bipolar transistor.

14. A semiconductor integrated circuit comprising:
   a semiconductor substrate having a well of a first conductive type, the semiconductor substrate being of a second conductive type;
   a first field-effect transistor formed in the well, the first field-effect transistor having a first doped region of the second conductive type connected to a first power line, a second doped region of the second conductive type, a first gate electrode disposed between the first and second doped regions, and an oxide film separating the first gate electrode from the surface of the well;
   a highly doped well-biasing region of the first conductive type formed in the well and connected to a second power line;
   a second field-effect transistor formed in the semiconductor substrate, the second field-effect transistor having a third doped region of the first conductive type connected to a third power line, a fourth doped region of the first conductive type, a second gate electrode disposed between the third and fourth doped regions, and an oxide film separating the second gate electrode from the surface of the semiconductor substrate;
   a first highly doped substrate-biasing region of the second conductive type formed in the semiconductor substrate and connected to a fourth power line; and
   a bipolar transistor having a base of the second conductive type, and a collector and an emitter of the first conductive type, the base and the collector being connected to the first highly doped substrate-biasing region and the emitter being connected to the third power line.

15. The semiconductor integrated circuit of claim 14, further comprising:
   a second highly doped region of the second conductive type functioning as a base electrode of the bipolar transistor;
   a fifth doped region of the first conductive type formed in the surface of the semiconductor substrate, functioning as the emitter of the bipolar transistor; and
   a sixth doped region of the first conductive type formed in the surface of the semiconductor substrate, functioning as a collector electrode of the bipolar transistor;
   the second highly doped substrate-biasing region and the sixth doped region being mutually interconnected, and connected to the first highly doped substrate-biasing region by a wiring pattern of the fourth power line.

16. The semiconductor integrated circuit of claim 14, further comprising a diode formed in the semiconductor substrate and connected in series between the highly doped substrate-biasing region and the collector of the bipolar transistor.

17. The semiconductor integrated circuit of claim 16, wherein the diode produces a voltage drop that brings a base-emitter voltage of the bipolar transistor into a cut-off region of the bipolar transistor.

18. The semiconductor integrated circuit of claim 14, further comprising a plurality of diodes formed in the semiconductor substrate, connected in series between the highly doped substrate-biasing region and the collector of the bipolar transistor.

19. The semiconductor integrated circuit of claim 18, wherein the diodes produce a series voltage drop that brings a base-emitter voltage of the bipolar transistor into a cut-off region of the bipolar transistor.

20. The semiconductor integrated circuit of claim 14, further comprising a resistor connected in series between the highly doped substrate-biasing region and the collector of the bipolar transistor.

* * * * *